(12) United States Patent (10) Patent No.: US 9,177,671 B2
Seningen et al. (45) Date of Patent: Nov. 3, 2015

(54) MEMORY WITH BIT LINE CAPACITIVE LOADING

(75) Inventors: Michael R. Seningen, Austin, TX (US); Michael E. Runas, McKinney, TX (US)

(73) Assignee: Apple Inc., Cupertino, CA (US)

( * ) Notice: Subject to any disclaimer, the term of this patent is extended or adjusted under 35 U.S.C. 154(b) by 676 days.

(21) Appl. No.: 13/403,543

(22) Filed: Feb. 23, 2012

(65) Prior Publication Data

US 2013/0223158 A1 Aug. 29, 2013

(51) Int. Cl.
*G11C 7/10* (2006.01)
*G11C 29/50* (2006.01)
*G11C 29/52* (2006.01)
*G11C 11/41* (2006.01)

(52) U.S. Cl.
CPC .............. *G11C 29/50* (2013.01); *G11C 29/52* (2013.01); *G11C 11/41* (2013.01); *G11C 2029/5002* (2013.01)

(58) Field of Classification Search
USPC .................... 365/189.02, 189.05, 238.5, 221
See application file for complete search history.

(56) References Cited

U.S. PATENT DOCUMENTS

| | | | |
|---|---|---|---|
| 5,068,830 A | 11/1991 | Plants et al. | |
| 5,206,552 A * | 4/1993 | Iwashita | 327/53 |
| 5,379,248 A * | 1/1995 | Wada et al. | 365/63 |
| 5,610,866 A | 3/1997 | McClure | |
| 5,677,889 A * | 10/1997 | Haraguchi et al. | 365/226 |
| 5,680,355 A * | 10/1997 | Saruwatari | 365/205 |
| 5,717,637 A * | 2/1998 | Hotta | 365/189.02 |
| 5,886,934 A * | 3/1999 | Nagaoka et al. | 365/189.11 |
| 6,006,339 A | 12/1999 | McClure | |
| 6,052,321 A | 4/2000 | Roohparvar | |
| 6,169,696 B1 | 1/2001 | Bissey | |
| 6,268,972 B1 | 7/2001 | Philpott et al. | |
| 6,363,001 B1 | 3/2002 | Borot et al. | |
| 6,515,907 B2 * | 2/2003 | Miyagi | 365/185.21 |
| 6,574,159 B2 | 6/2003 | Ohbayashi et al. | |
| 6,611,448 B2 | 8/2003 | Nair et al. | |
| 6,885,600 B2 | 4/2005 | Tran et al. | |
| 7,016,234 B2 * | 3/2006 | Ishida et al. | 365/189.16 |
| 7,164,612 B1 | 1/2007 | Eleyan et al. | |
| 7,184,337 B2 | 2/2007 | Versen | |
| 7,286,425 B2 * | 10/2007 | Barth, Jr. | 365/205 |
| 7,298,659 B1 | 11/2007 | Kengeri et al. | |
| 7,313,041 B1 | 12/2007 | Chapman et al. | |
| 7,499,347 B2 * | 3/2009 | Chen et al. | 365/194 |

(Continued)

FOREIGN PATENT DOCUMENTS

KR 20030079078 10/2003

OTHER PUBLICATIONS

Mukhopadhyay et al., "Leakage Current Based Stabilization Scheme for Robust Sense-Amplifier Design for Yield Enhancement in Nanoscale SRAM," Proceedings of the 14th Asian Test Symposium (ATS '05), Dec. 18-21, 2005, pp. 176-181.

(Continued)

*Primary Examiner* — Pho M Luu
(74) *Attorney, Agent, or Firm* — Meyertons, Hood, Kivlin, Kowert & Goetzel, P.C.

(57) ABSTRACT

A memory that may allow for the detection of weak data storage cells may include data storage cells, a column multiplexer, a sense amplifier, and a load circuit. The load circuit may include one or more capacitive loads and may be operable to controllably select one or more of the capacitive loads to couple to the input of the sense amplifier.

16 Claims, 10 Drawing Sheets

(56) References Cited

U.S. PATENT DOCUMENTS

| | | |
|---|---|---|
| 7,642,620 B2 | 1/2010 | Tanaka |
| 7,675,783 B2 | 3/2010 | Park et al. |
| 7,724,584 B2 | 5/2010 | Lee |
| 7,805,645 B2 | 9/2010 | Frey et al. |
| 7,872,929 B2 | 1/2011 | Dell et al. |
| 8,553,482 B2 * | 10/2013 | Chow ............................ 365/205 |
| 8,611,165 B2 | 12/2013 | Kazuno |
| 8,767,459 B1 * | 7/2014 | Kasorla et al. ........... 365/185.03 |
| 2003/0107920 A1 | 6/2003 | Roohparvar |
| 2003/0206435 A1 | 11/2003 | Takahashi |
| 2005/0024967 A1 * | 2/2005 | Matsuoka ..................... 365/207 |
| 2005/0035373 A1 * | 2/2005 | Ishida et al. ................. 257/202 |
| 2006/0242386 A1 | 10/2006 | Wood |
| 2008/0130385 A1 | 6/2008 | Chung |
| 2009/0021996 A1 | 1/2009 | Versen et al. |
| 2009/0323446 A1 | 12/2009 | Zhang et al. |
| 2010/0246293 A1 | 9/2010 | Dudeck et al. |
| 2011/0116300 A1 | 5/2011 | Maejima |
| 2012/0008384 A1 | 1/2012 | Li et al. |
| 2012/0069638 A1 | 3/2012 | Matsuda et al. |
| 2012/0230116 A1 | 9/2012 | Goda et al. |

OTHER PUBLICATIONS

Paul Zuber, et al., "A Holistic Approach for Statistical SRAM Analysis," published in 47th ACM/IEEE Design Automation Conference (DAC), Jun. 13-18, 2010, pp. 717-722.

Mohamed H. Abu-Rahrna, et al., "A Methodology for Statistical Estimation of Read Access Yield in SRAMs," published in 45th ACM/IEEE Design Automation Conference (DAC), Jun. 8-13, 2008, pp. 205-210.

* cited by examiner

MEMORY WITH BIT LINE CAPACITIVE LOADING

BACKGROUND

1. Technical Field

This invention is related to the field of memory implementation, and more particularly to techniques for data storage cell testing.

2. Description of the Related Art

Memories typically include a number of data storage cells composed of interconnected transistors fabricated on a semiconductor substrate. Such data storage cells may store a single data bit or multiple data bits and may be constructed according to a number of different circuit design styles. For example, the data storage cells may be implemented as a single transistor coupled to a capacitor to form a dynamic storage cell. Alternatively, cross-coupled inverters may be employed to form a static storage cell or a floating gate MOSFET may be used to create a non-volatile storage cell.

During the semiconductor manufacturing process, variations in lithography, transistor dopant levels, etc., may result in different electrical characteristics between transistors that are intended to have identical characteristics. Additional variation in electrical characteristics may occur due to aging effects within transistors as the device is repeatedly operated. These differences in electrical characteristics between transistors can result in data storage cells that output different small signal voltages for the same stored data. In a memory array, there may be a large variation in the small signal output voltages across the data storage cells that comprise the memory array.

Data from data storage cells that generate a smaller than average output signal due to the previously described variation may not be able to be read correctly, resulting in a misread. Data storage cells that fail to read properly may contribute to lower manufacturing yield and necessitate additional redundant data storage cells to maintain manufacturing yield goals.

SUMMARY

Various embodiments of a memory circuit are disclosed. In an embodiment, the memory circuit may include a plurality of data storage cells, a column multiplexer, a sense amplifier, and a load circuit. The load circuit may couple load devices to the input of the sense amplifier. In some embodiments, the load circuit may be operable to controllably couple load devices to one of the inputs of a sense amplifier configured to amplify a differentially encoded signal.

The load circuit may include a number of load devices and may be operable to controllably select one or more of the load devices to couple to the input of the sense amplifier. In some embodiments, the load devices may be of differing sizes.

During operation, test data may be stored into a data storage cell. The data may be read from the data storage cell using the sense amplifier and compared to the original test data. The data may also be read from the data storage cell using the sense amplifier with load devices coupled to the input of the sense amplifier and compared to the original test data. The result of these comparisons may be used to determine the strength of the data storage cell. In some embodiments, information indicative of the strength of the data storage cell may be stored for later use.

BRIEF DESCRIPTION OF THE DRAWINGS

The following detailed description makes reference to the accompanying drawings, which are now briefly described.

Figure 1:
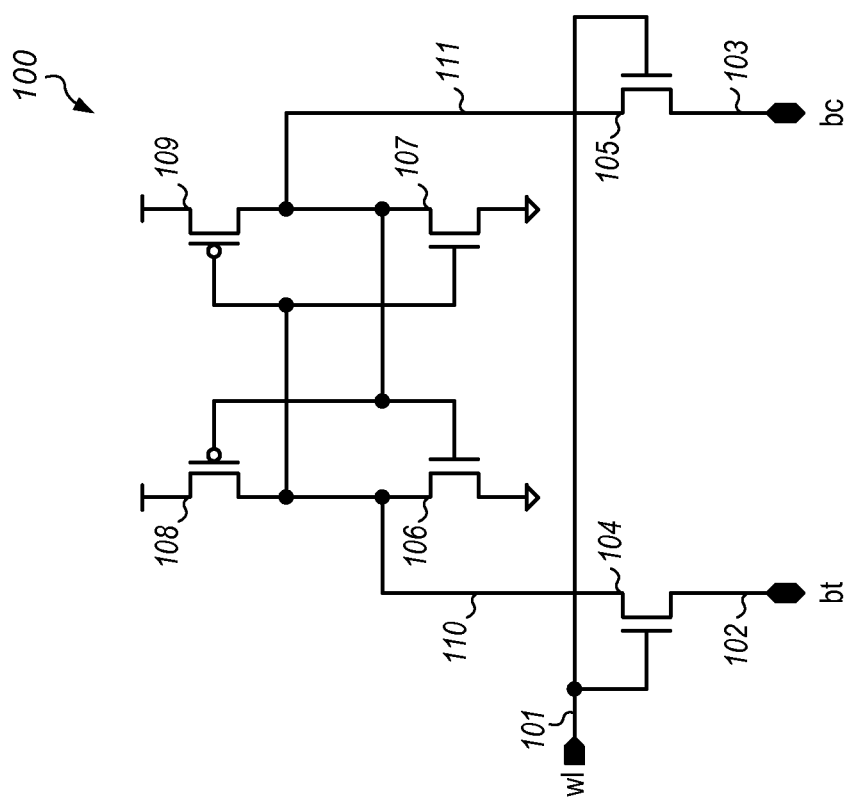
FIG. 1 illustrates an embodiment of a data storage cell.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

During the manufacture of a semiconductor memory circuit, differences in lithography, implant levels, etc., may result in differences in electrical characteristics between data storage cells that are otherwise intended to be identical in characteristics and performance. In some cases, the variation of the electrical characteristics of a data storage cell may be sufficiently large that the data storage cell may not function (e.g., read or write) under normal operating conditions of the memory circuit, resulting in the data storage cell being identified as a failure and requiring replacement with a redundant data storage cell. Adding redundant data storage cells to the memory circuit to compensate for data storage cells with non-ideal electrical characteristics may result in additional chip area and power consumptions. The embodiments illustrated below may provide techniques to identify and compensate for data storage cells with non-ideal electrical characteristics.

FIG. 1 illustrates a data storage cell according to one of several possible embodiments. In the illustrated embodiment, data storage cell 100 includes a true I/O 102 denoted as "bt," a complement I/O 103 denoted as "bc," and a selection input 101 denoted as "wl."

In the illustrated embodiment, bt 102 is coupled to selection transistor 104 and bc 101 is coupled to selection transistor 105. Selection transistor 104 and selection transistor 105 are controlled by wl 101. Selection transistor 104 is further coupled to pull-up transistor 108 and pull-down transistor 106 through node 110, and selection transistor 105 is further coupled to pull-up transistor 109 and pull-down transistor 107 through node 111. Pull-up transistor 108 and pull-down transistor 106 are controlled by node 111, and pull-up transistor 109 and pull-down transistor 107 are controlled by node 110.

It is noted that although selection transistors, pull-up transistors, pull-down transistors, and pre-charge transistors may be illustrated as individual transistors, in other embodiments, any of these transistors may be implemented using multiple transistors or other suitable circuits. That is, in various embodiments, a "transistor" may correspond to an individual transistor or other switching element of any suitable type (e.g., a field-effect transistor (FET)), or to a collection of transistors.

At the start of the storage operation true I/O 102 and complement I/O 103 may both be high and selection input 101 is low. It is noted that in this embodiment, low refers to a voltage at or near ground potential and high refers to a voltage sufficiently large to turn on n-channel metal oxide semiconductor field effect transistors (MOSFETs) and turn off p-channel MOSFETs. In other embodiments, other circuit configurations may be used and the voltages that constitute low and high may be different. During the storage, or write, operation, selection input 101 may be switched high which couples true I/O 102 to node 110 and complement I/O 103 to node 111. To store a logical 1 into data storage cell 100, complement I/O 103 may be switched to a low. Since selection transistor 105 is on, node 111 is also switched low. The low on node 111 activates pull-up transistor 108 which charges node 110 high. The high on node 110, in turn, activates pull-down transistor 107, which further reinforces the low on node 111 establishing regenerative feedback. Once the regenerative feedback between nodes 110 and 111 has been established, selection input 101 may be switched low turning off selection transistor 104 and selection transistor 105, isolating node 110 from true I/O 102 and node 111 from complement I/O 103. The method of storing a logical 0 may be similar. Selection input 101 may be switched high and true I/O 102 may be switched low. Selection transistor 104 couples the low on true I/O 102 to node 110, which activates pull-up transistor 109. The high on node 111 activates pull-down transistor 106, reinforcing the low on node 110 and establishing the regenerative feedback. Data storage cells that store data via regenerative feedback are commonly referred to as static cells.

In the illustrated embodiment, data storage cell 100 outputs its stored data as the difference in voltage between true I/O 102 and complement I/O 103. (Data stored as the difference between two voltages may also be referred to herein as "differentially encoded".) At the start of the output process, true I/O 102 and complement I/O 103 may both be high and selection input 101 may be low. Asserting selection input 101 activates selection transistor 104 and selection transistor 105. If node 111 is low and node 110 is high, then a current will flow through selection transistor 105 and pull-down transistor 107 causing a reduction in voltage on complement I/O 103. If node 110 is low and node 111 is high, then a current will flow through selection transistor 104 and pull-down transistor 106 causing a reduction in voltage on true I/O 102. For either data state, the current that the data storage cell sinks from either the true I/O 102 or complement I/O 103 is referred to as the read current of the cell.

Ideally, the electrical characteristics of pull-down transistor 106 and pull-down transistor 107 would be identical, as would be the electrical characteristics of selection transistor 104 and selection transistor 105. Furthermore, in an ideal circuit, it might be desirable that pull-down transistor 106 and pull-down transistor 107 in one data storage cell in a memory device have identical electrical characteristics to pull-down transistor 106 and pull-down transistor 107 in another data storage cell in the memory device. However, during the semiconductor manufacturing process, differences in lithography, fluctuations in dopant levels, etc., may result in these transistors having different electrical characteristics (e.g., saturation current). Aging effects induced by, e.g., hot-carrier injection may also change a transistor's electrical characteristics over time. Variation, due to both manufacturing and aging effects, in pull-down transistor 106, pull-down transistor 107, selection transistor 104 and selection transistor 105 from one data storage cell to another may result in variation in read currents and, therefore, variation in output voltages for the same stored data.

In some cases, the variation in the electrical characteristics of the transistors may result in larger than average output voltages when the storage cell is read. Data storage cells that generate larger than average output voltages may be referred to as strong cells. In some cases, the variation in the electrical characteristic of the transistors may result in smaller than average output voltages when the storage cell is read. Data storage cells that generate smaller than average output voltages may be referred to as weak cells. If the value of the output voltage generated by a weak storage cell is sufficiently small, it may not be possible to properly determine the data stored in the data storage cell, because the output voltage may not be able to overcome imbalances and signal noise within a sense amplifier.

It is noted that the number of transistors and the connectivity shown in FIG. 1 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as, e.g., in a single-bit or multi-bit non-volatile or flash memory) may be used to store data in a data storage cell.

Figure 2:
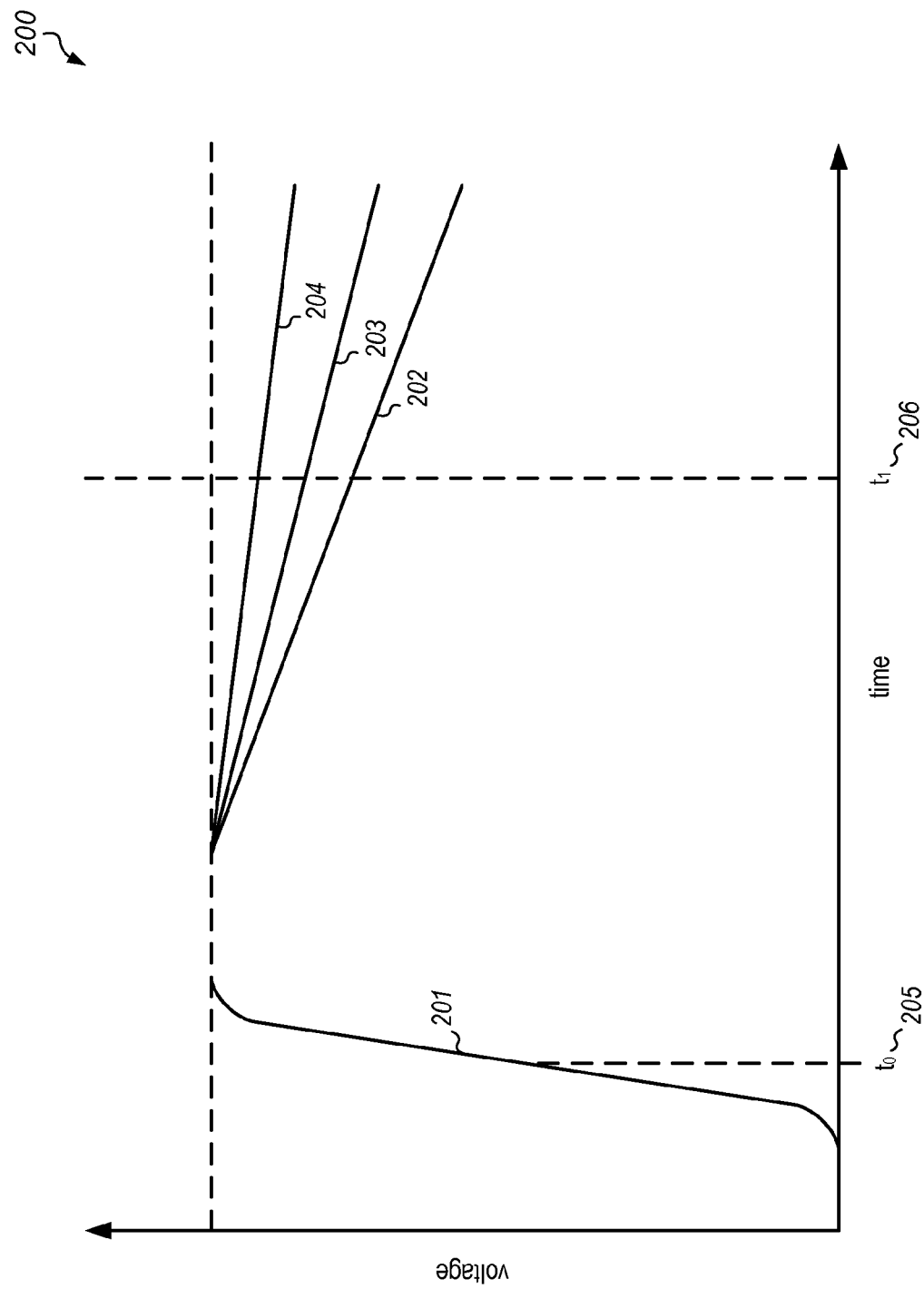
FIG. 2 illustrates possible waveforms for the discharge of bit lines.

FIG. 2 illustrates possible waveforms resulting from the operation of the embodiment of the data storage cell shown in FIG. 1. At time $t_0$ 205, the selection input 101 is asserted (waveform 201). Depending on the value of the stored data, either true I/O 102 or complement I/O 103 will begin to discharge (waveform 203). At time $t_1$ 206, the small signal differential between true I/O 102 and complement I/O 103 is amplified by a sense amplifier. The system including one or more data storage cells may be modeled as a capacitor and current source. The capacitor may represent the total capacitance present on either true I/O 102 or complement I/O 103, which may include the junction capacitance of other data storage cells' I/O ports and the capacitance of the interconnect between the data storage cells. The current source is the read current of the data storage cell. With this model, the voltage on the low-going I/O from time $t_0$ to time $t_1$ can be estimated using equation 1.

$$v(t) = \frac{1}{C} \int_{t_2}^{t_1} i(t) \, dt \qquad (1)$$

Over a limited range of time and voltages, the read current can be treated as a constant. This allows the equation to be simplified as shown in equation 2. For a constant load capacitance, the voltage change on the low-going I/O is proportional to the read current of the data storage cell. If the read current of the data storage cell is less than average, then the change in voltage on the low-going I/O will be less (waveform 204), resulting in a smaller differential voltage at the time the sense amplifier is activated. If the read current of the data storage cell is larger than average, then the change in voltage on the low-going I/O will be greater (waveform 202), resulting in a larger differential at the time the sense amplifier is activated. It is noted that the waveforms shown in FIG. 2 are merely an illustrative example and that, in other embodiments, differing waveform behavior may be possible.

$$\Delta v = \frac{i_{read}}{C(t_1 - t_2)} \qquad (2)$$

Figure 3:
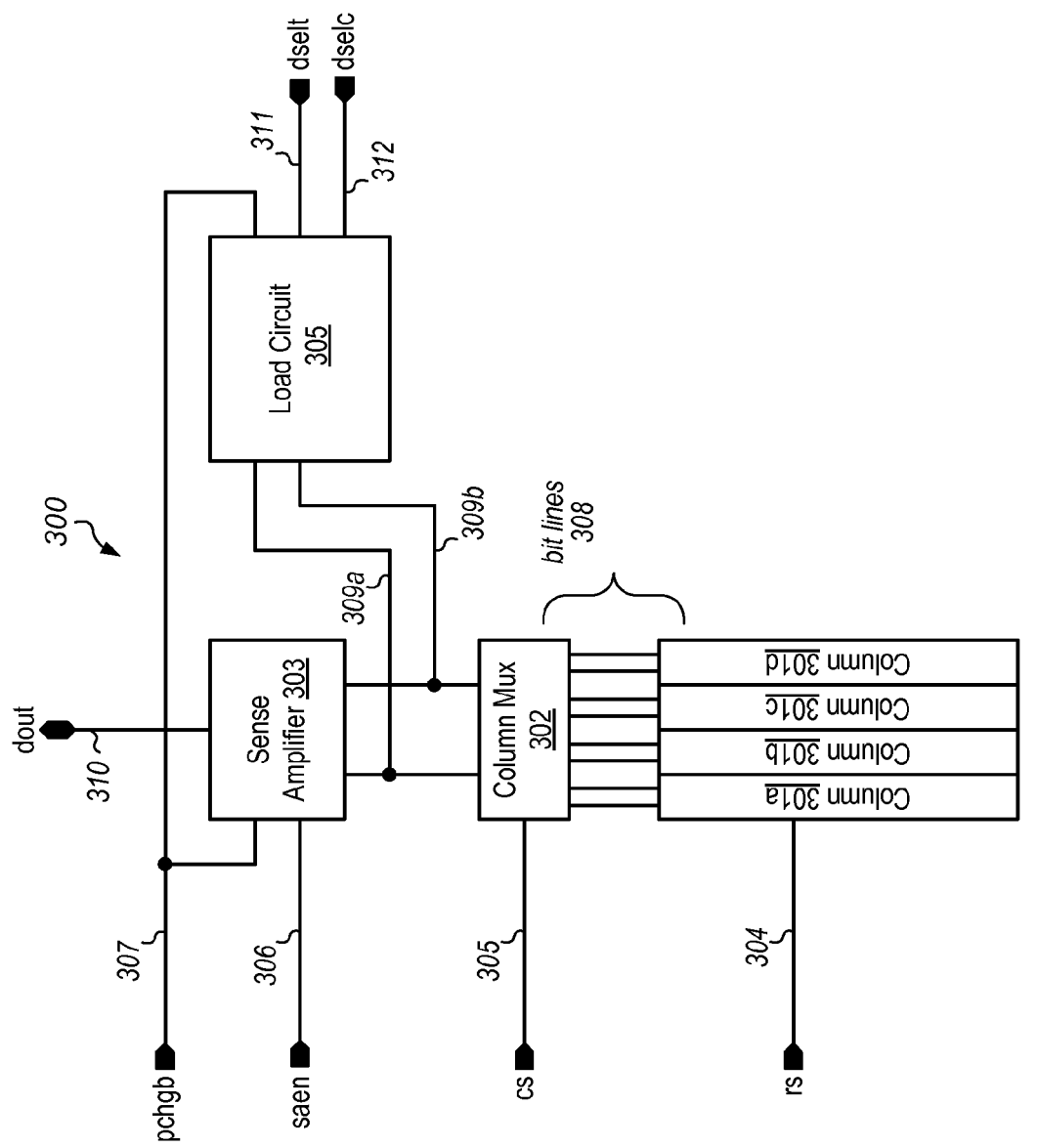
FIG. 3 illustrates an embodiment of a memory sub-array.

FIG. 3 illustrates an embodiment of a memory sub-array which includes a data output 310 denoted as "dout," a pre-charge control input 307 denoted as "pchgb," a sense amplifier enable input 306 denoted as "saen," a true data selection input 311 denoted as "dselt," and a complement data selection input 312 denoted as "dselc." The illustrated embodiment also includes one or more column selection inputs 305 denoted as "cs" and one or more row selection inputs 304 denoted as "rs."

In the illustrated embodiment, columns 301a, 301b, 301c, and 301d are coupled to the inputs of column multiplexer 302 through bit lines 308. The differentially encoded output of column multiplexer 302 is coupled to the differential inputs of sense amplifier 303 through nodes 309a and 309b, and the output of sense amplifier 303 is coupled to dout 310. Load circuit 305 is also coupled to the differential inputs of sense amplifier 303.

Each column 301 may include one or more of data storage cell 100. For example, the individual bit lines bt 102 of each data storage cell 100 within a column 301 may be coupled together to form a true bit line 308 of column 301. Likewise, the individual bit lines bc 103 of each data storage cell 100 within column 301 may be coupled together to form a complement bit line 308 of column 301. Individual word lines wl 101 of each data storage cell 100 within column 301 may be coupled to a respective one of rs 304 such that when a given rs 304 is asserted, the corresponding data storage cell 100 creates a differentially encoded output on the true bit line and complement bit line of column 301, while the bit line outputs of the remaining data storage cells 100 within column 301 remain quiescent. In other embodiments, the data storage cells may be dynamic storage cells, single-bit or multi-bit non-volatile storage cells, or mask programmable read-only storage cells. It is noted that in some embodiments, the data storage cell may transmit data in a single-ended fashion. In such cases, only a single bit line per column is required.

In some embodiments, column multiplexer 302 may contain one or more pass gates controllable by cs 305. The input of each pass gate may be coupled to the either the true or complement bit line output from one of columns 301a, 301b, 301c, and 301d. The output of each pass gate coupled to a true bit line is coupled to the true output of column multiplexer 302 in a wired-OR fashion, and the output of each pass gate coupled to a complement bit line is coupled to the complement output of column multiplexer 302 in a wired-OR fashion. In other embodiments, column multiplexer 302 may contain one or more logic gates configured to perform the multiplexer selection function.

Sense amplifier 303 may use analog amplification techniques in some embodiments. In other embodiments, sense amplifier 303 may employ a latch based amplification technique. Load circuit 305 may contain load devices and selection transistors as will be described in reference to FIG. 5 and FIG. 6.

Figure 4:
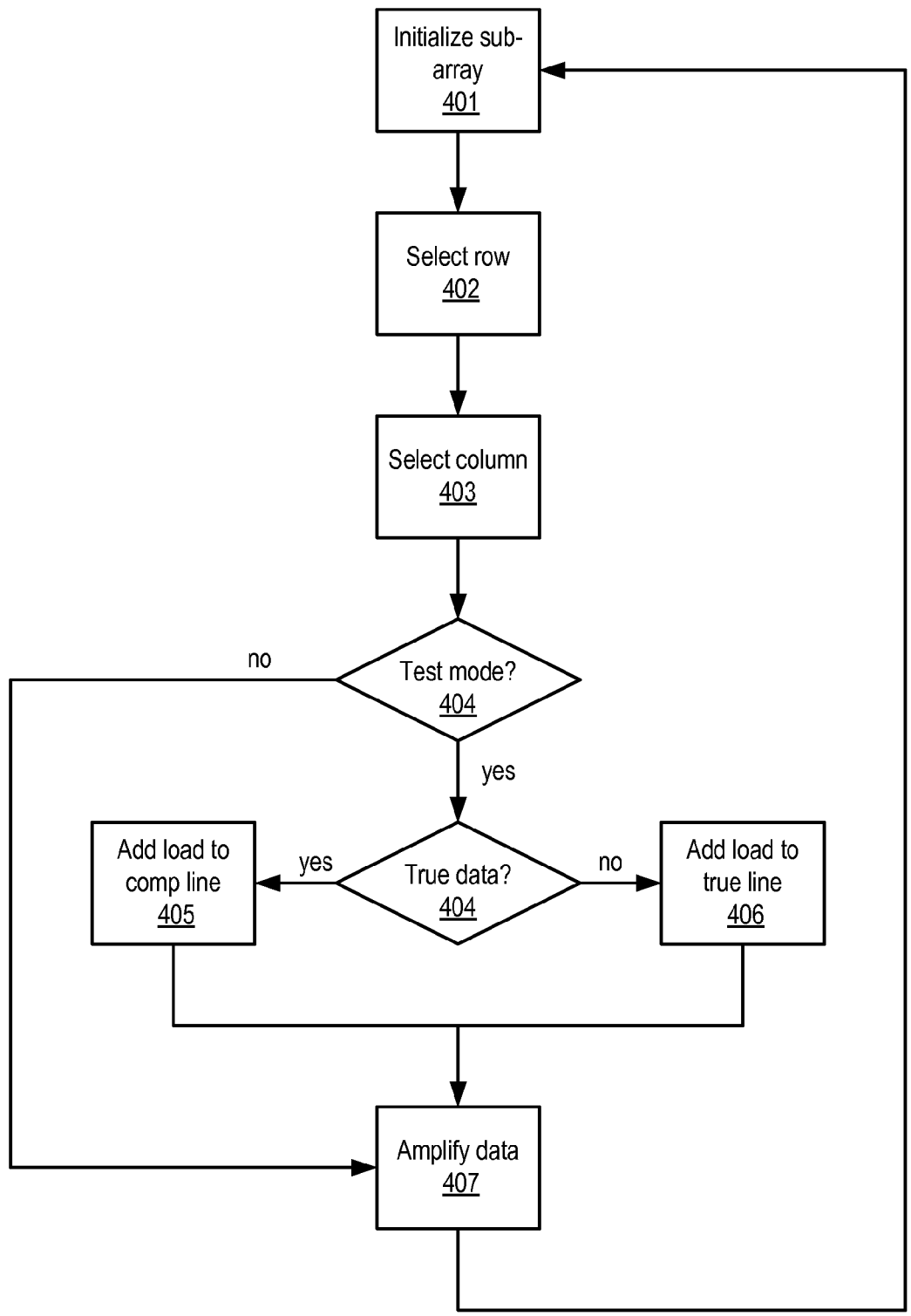
FIG. 4 illustrates a possible method of operating the embodiment illustrated in FIG. 3.

In some embodiments, the illustrated sub-array 300 may operate as follows. Referring collectively to FIG. 3 and the flowchart illustrated in FIG. 4, the operation may start by initializing the sub-array (block 401) by setting pchgb 307 low and setting rs 304, cs 305, and saen 306 to inactive states. Once sub-array 300 has been initialized, one of rs 304 may be asserted (block 402) selecting a data storage cell in each of columns 301a, 301b, 301c, and 301d. One of cs 305 may then be asserted (block 403), causing column multiplexer 302 to output data selected from one of bit lines 308.

The operation then depends on whether or not sub-array 300 is operating in test mode (block 404). When sub-array 300 is not operating in test mode, pchgb 307 may be set high (disabling pre-charge) and saen 306 may be asserted causing sense amplifier to amplify the difference between nodes 309a and 309b and couple the amplified result to dout 310 (block 407). Sub-array 300 may then be re-initialized by de-asserting saen 306, and the asserted one of rs 304 and cs 305, and setting pchgb 307 low (block 401).

When sub-array 300 is operating in test mode, the operation then depends on the value of the test data previously loaded into the selected data storage cell (block 404). When a logical 1 was loaded then dselc 311 may be set low causing load circuit 305 to couple additional capacitive load onto the complement input of sense amplifier 303. With the additional capacitive load, the equation governing the change of voltage on the complement input of sense amplifier 303 may be re-written as shown in Equation 3. Since the change in voltage is inversely proportional to the total capacitance, the change in voltage on the complement input of sense amplifier 303 may be reduced. Once the additional capacitive load has been coupled to the complement input of sense amplifier 303, the amplification operation (block 407) and initialization operation (block 401) can proceed as described above.

$$\Delta v = \frac{i_{read}}{((C_{inherent} + C_{additional}))(t_2 - t_0)} \qquad (3)$$

Figure 5:
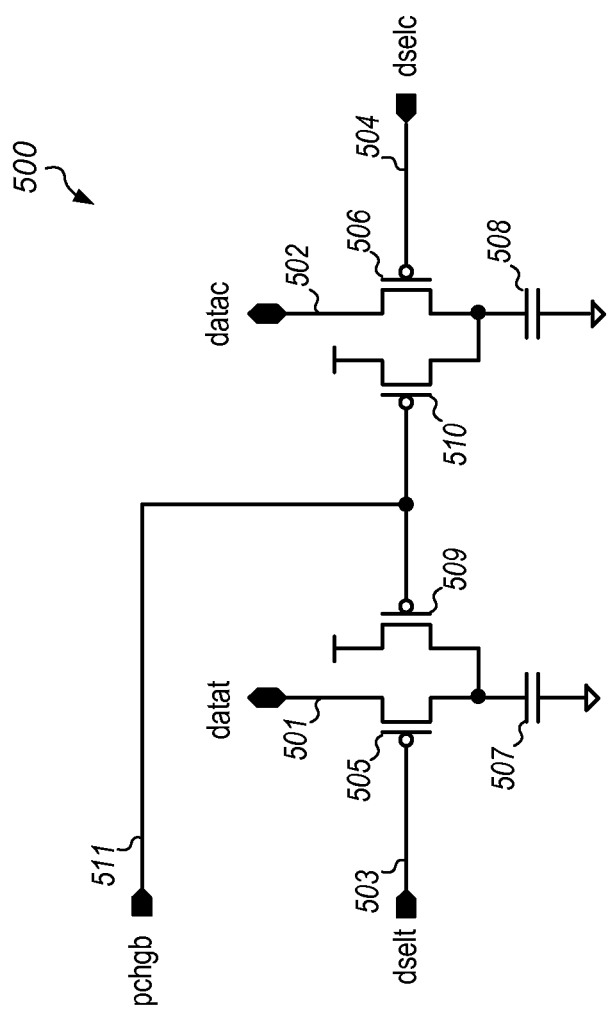
FIG. 5 illustrates an embodiment of a load circuit.

FIG. 5 illustrates an embodiment of a load circuit for use with differentially encoded data. The illustrated embodiment includes a true data port 501 and a complement data port 502, respectively denoted as "datat" and "datac," as well as a pre-charge control input 511 denoted as "pchgb." The embodiment further includes a true data selection input 503 and a complement data selection input 504, respectively denoted as "dselt" and "dselc."

In the illustrated embodiment, datat 501 is coupled to selection transistor 505 and datac 502 is coupled to selection transistor 506. Selection transistor 505 is controlled by dselt 503 and selection transistor 506 is controlled by dselc. Selection transistor 505 is further coupled to load device 507 and pre-charge transistor 509. Selection transistor 506 is further coupled load device 508 and pre-charge transistor 510. Pre-charge transistor 509 and pre-charge transistor 510 are controlled by pchgb 511. In some embodiments, load devices 507 and 508 may be capacitors fabricated using a dedicated oxide layer (e.g., MOM capacitor) or using the insulating material between metal layers (e.g., MIM capacitor). In other embodiments, the load devices may be gate terminals of MOSFETs, or the input/output ports of de-selected data storage cells. It is noted that in alternative embodiments, other numbers and configurations of transistors and devices may be employed.

During normal read operation, dselt 503 and dselc 504 may both be set high isolating the data inputs from the load devices 507 and 508, and pchgb 511 may be set low activating pre-charge transistors 509 and 510. During test read operation, dselt 503 and dselc 504 may be initialized high, and pchgb 511 may be set low activating precharge transistors 409 and 410. When test data is to be read from a data storage cell, either dselt 503 or dselc 504 may be set low depending on the anticipated value of the test data, and pchgb 511 may be set high, deactivating precharge transistors 509 and 510. For example, if the test data to be read is a logical 1, then dselc may be set low activating selection transistor 506, coupling datac 502 to load device 508. Dselt 503 may remain high, isolating datat 501 from load device 507.

Figure 6:
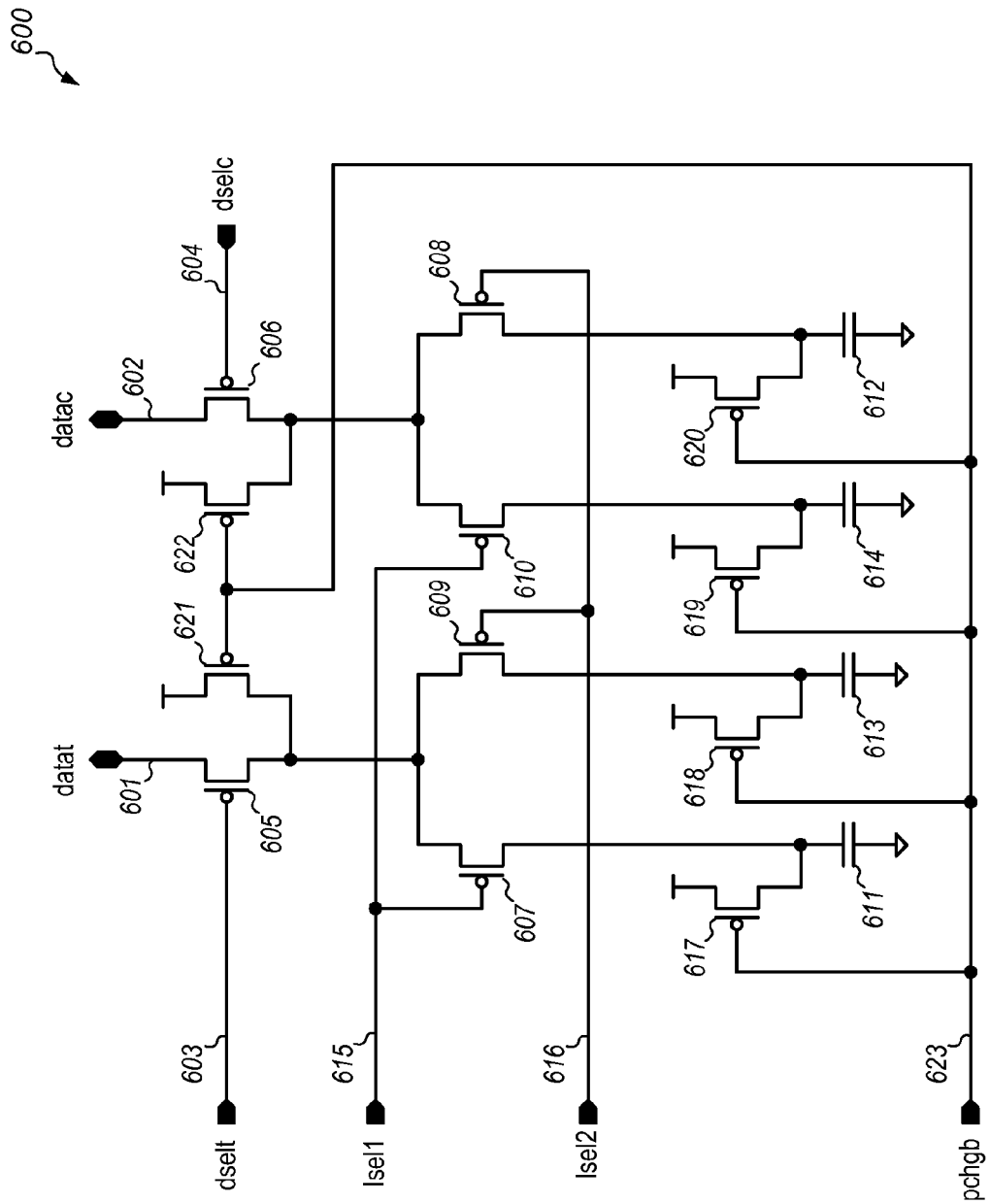
FIG. 6 illustrates an embodiment load circuit with multiple loads.

FIG. 6 illustrates a variant of load circuit 500 that provides multiple load devices. In the illustrated embodiment, load circuit 600 includes a number of input and I/O ports that are similar to load circuit 500: a true data I/O 601 and a complement data I/O 602, respectively denoted as "datat" and "datac," a true data selection input 603 and a complement data selection input 604, respectively denoted as "dselt" and "dselc," and a pre-charge control input 623 denoted as "pchgb." In contrast to load circuit 500, load circuit 600 includes a first load selection input 615 and a second load selection input 616 denoted, respectively denoted as "lsel1" and "lsel2."

As shown in FIG. 6, datat 601 is coupled to selection transistor 605 and datac 602 is coupled to selection transistor 606. Selection transistor 605 is controlled by dselt 603 and selection transistor 606 is controlled by dselc 604. Selection transistor 605 is further coupled to pre-charge transistor 621 and selection transistors 607 and 609. Selection transistor 606 is further coupled to pre-charge transistor 621 and selection transistors 610 and 608. Pre-charge transistors 621 and 622 are controlled by pchgb 623. Selection transistors 607 and 610 are controlled by lsel1 615, and selection transistors 609 and 608 are controlled by lsel2 616. Selection transistor 607 is further coupled to pre-charge transistor 617 and load device 611, and selection transistor 609 is further coupled to pre-charge transistor 618 and load device 613. Selection transistor 610 is further coupled to pre-charge transistor 619 and load device 614, and selection transistor 608 is further coupled to pre-charge transistor 620 and load device 612. Pre-charge transistors 617, 618, 619, and 620 are controlled by pchgb 623. It is noted that in other embodiments, the number and configuration of transistors and devices may be different.

During normal read operation, dselt 603, dselc 604, lsel1 615, and lsel2 616 may be set high, isolating datat in 601 and datac in 602 from the load devices 611, 612, 613 and 614. Pchgb 623 may be set low activating precharge transistors 617, 618, 619, 620, 621, and 622.

During test read operation, dselt 603, dselc 604, lsel1 615, and lsel2 616 may be initialized high. Additionally, pchgb 623 may be set low activating precharge transistors 617, 618, 619, 620, 621, and 622. When test data is to be read from a data storage cell, pchgb 623 may be set high, and either dselt 603 or dselc 604 may be set low depending on the anticipated value of the test data, and either lsel1 615 or lsel2 616 may be set low depending on the desired amount of additional load. For example, if the test data to be read is a logical 1, then dselc 604 may be set low activating selection transistor 606. If lsel1 615 is set low, selection transistor 610 will become active, coupling datac 602 to load device 614. Dselt 603 will remain high, isolating datat 601 from load devices 611 and 613. In some embodiments, dselt 603 and dselc 604 may be set low simultaneously, and lsel1 615 and lsel2 616 may be set low simultaneously.

Figure 7:
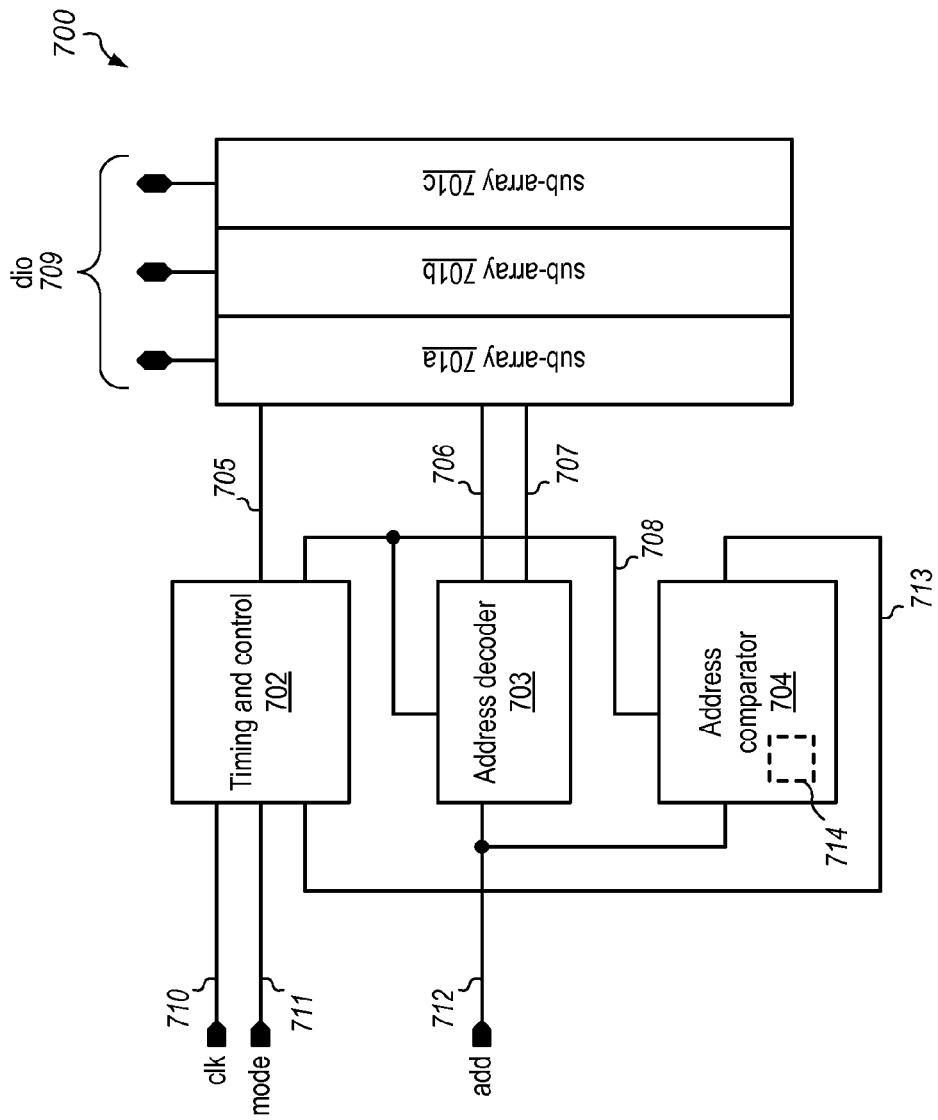
FIG. 7 illustrates an embodiment of a memory.

FIG. 7 illustrates a memory according to one of several possible embodiments. In the illustrated embodiment, memory 700 includes data I/O ports 709 denoted "dio," an address bus input 712 denoted "add," mode selection inputs 711 denoted "mode," and a clock input 710 denoted "clk."

In the illustrated embodiment, memory 700 includes sub-arrays 701a, 701b, and 701c, timing and control unit 702, address decoder 703, and address comparator 704. Sub-arrays 701a, 701b, and 701c may incorporate some or all of the features described above with respect to sub-arrays 300. Timing and control unit 702 is coupled to provide a decoder enable signal 708 to address decoder 703 and address comparator 704, and control signals 705 to sub-arrays 701a, 701b, and 701c. In some embodiments, control signals 705 may include a pre-charge signal, a sense amplifier enable signal, a true data selection signal, a complement data selection, a first load selection signal, and a second load selection signal that may operate as described above with respect to sub-array 300 and load circuits 500 and 600.

Address decoder 703 is coupled to provide row selects 706 and column selects 707 to sub-arrays 701a, 701b, and 701c, in response to the assertion of decoder enable signal 705 and the address value on address bus 712. Address comparator 704 is coupled to provide read-miss indication signal 708 to timing and control unit 702 based upon a comparison of the address value on add 712 to a collection of address values previously determined to select weak data storage cells in sub-arrays 701a, 701b, and 701c. In some embodiments, address comparator 704 may include a storage unit 714 configured to store address values that select weak data storage cells.

Figure 8:
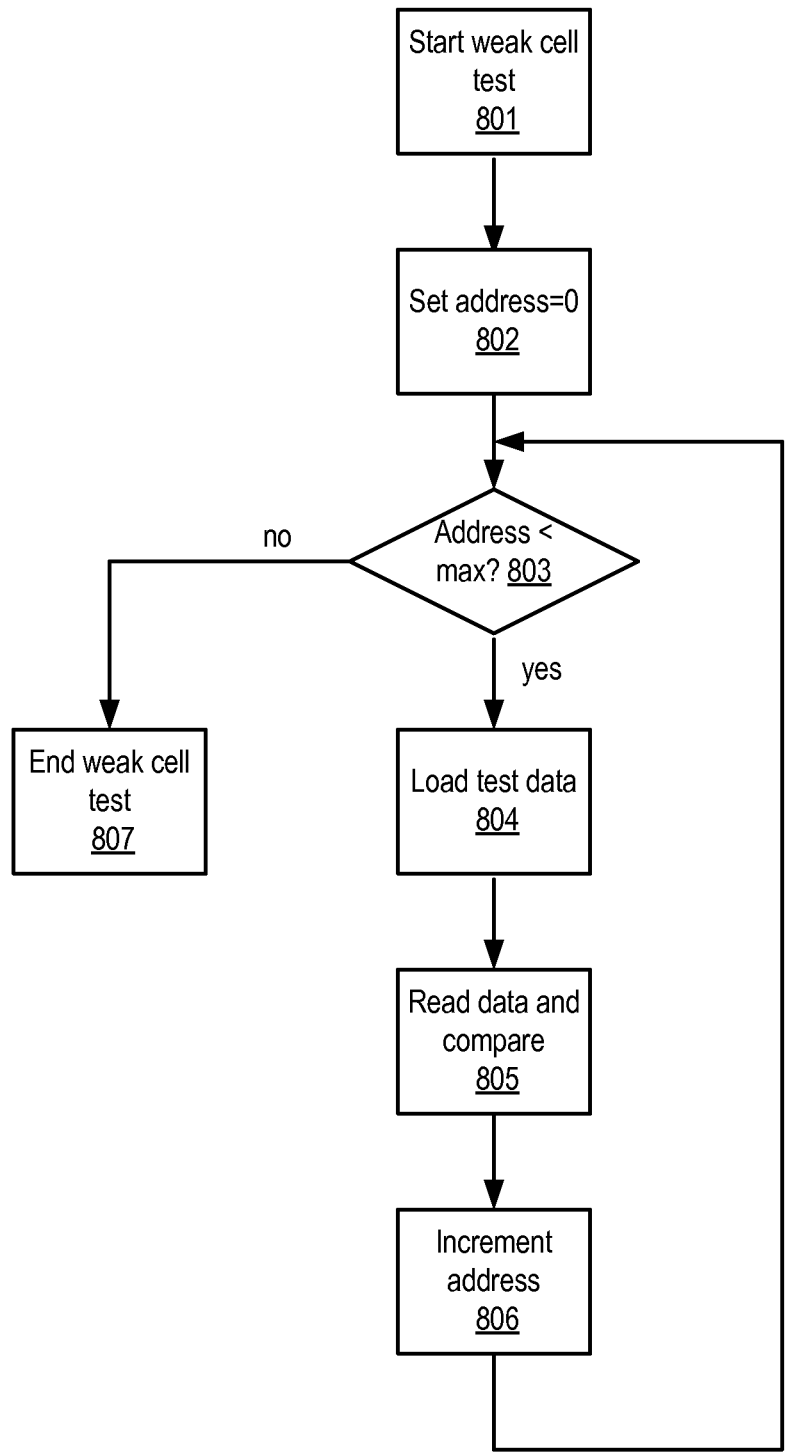
FIG. 8 illustrates a possible method of operating the embodiment illustrated in FIG. 7.

FIG. 8. Illustrates a possible method of operating memory 700 to test for weak data storage cells. Referring collectively to FIG. 7 and the flowchart illustrated in FIG. 8, the operation starts in block 801. The value presented to add 712 may be set to zero (block 802). The operation then depends on the value presented to add 712. When the value presented to add 712 exceeds the maximum address of memory 700, the test ends (block 807). When the value presented to add 712 is less than the maximum address of memory 700, mode 711 may be set for a write operation, test data may be presented to dio 709, and clk 710 may be asserted, writing the test data into the data storage cells selected by the value presented to add 712 (block 804).

Once the test data has been loaded, memory 700 may be re-initialized. Mode 711 may be set for read and test operation and clk 710 may be asserted initiating the read and comparison operation as will be described in reference to FIG. 9 (block 805). When the read and comparison operation has completed, memory 700 may be re-initialized and the value on add 712 may be incremented (block 806) and the value checked against the maximum address for memory 700 (block 803). It is noted that operations shown in FIG. 8 are merely an illustrative example and that in actual circuit operation, other operations and order of operations may be possible.

Figure 9:
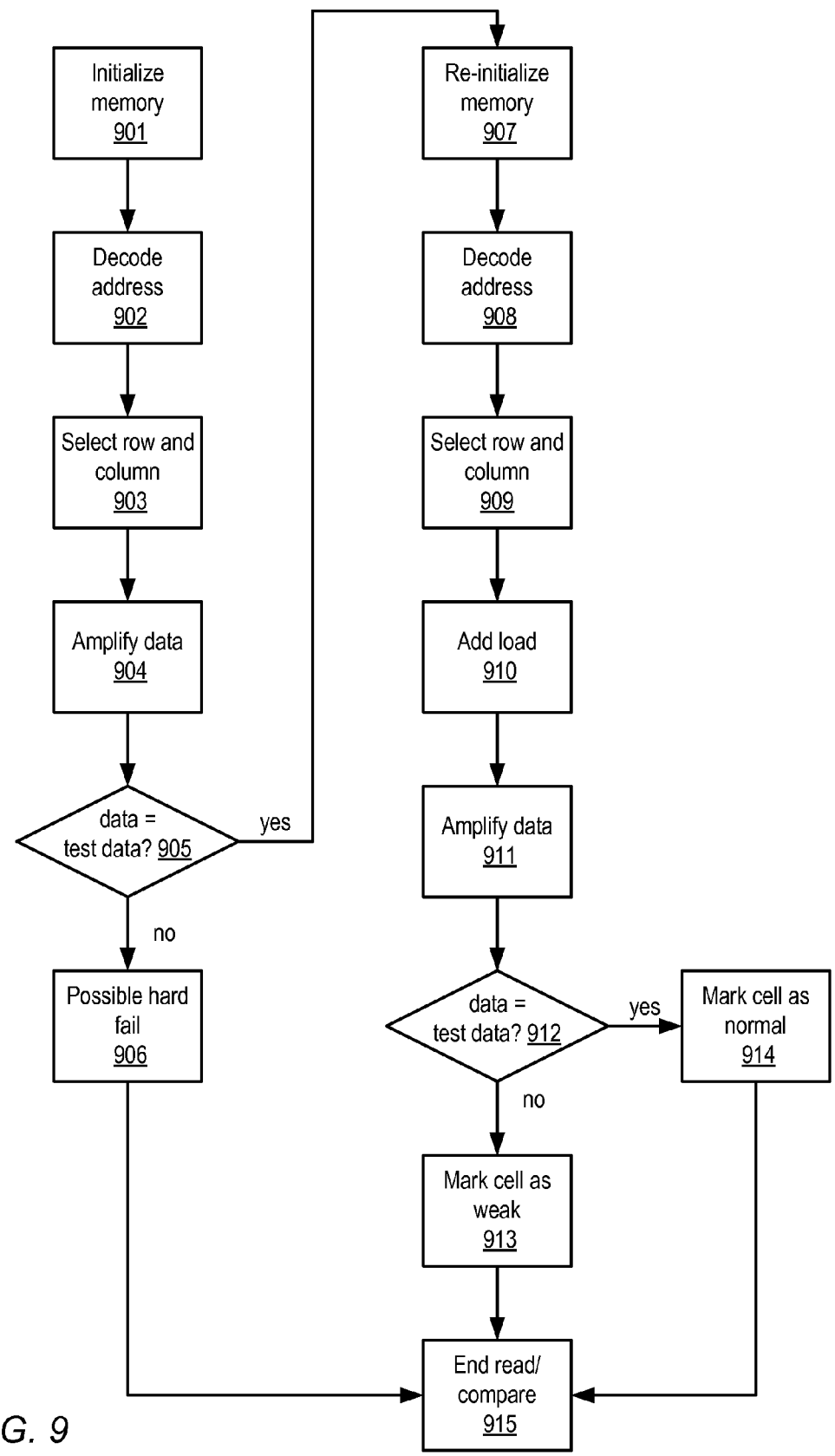
FIG. 9 illustrates a possible method of reading a memory and comparing the stored data to previously loaded test data

A possible method of operating memory 700 to read and compare previously loaded test data is illustrated in FIG. 9. Referring collectively to FIG. 7 and the flow chart illustrated in FIG. 9, the operation may begin by de-asserting clk 710 to initialize memory 700 (block 901). Mode 711 may be set for normal read operation and clk 710 may be asserted which causes timing and control unit 702 to assert decoder enable signal 708. Address decoder 703 decodes the address presented to add 712 (block 903) in response to the assertion of decoder enable signal 708, and asserts one of row selects 706 and one of column selects 707 (block 903) selecting a data storage cell in each of sub-arrays 701a, 701b, and 701c. Timing and control unit 702 may then assert the appropriate signal in control signals 705 to activate the sense amplifiers in sub-arrays 701a, 701b, and 701c, causing them to amplify the data from the selected data storage cells and output the amplified data to dio 709 (block 904).

The operation then depends on value of data output on dio 709 (block 905). When the data output on dio 709 does not match the originally loaded test data, the selected data storage cells may contain one or more hard failures (block 906). In this test flow, no further action is taken and the test of data storage cells at the given address is complete (block 915). When the data output on dio 709 matches the originally loaded test data, further testing may be necessary and clk 710 is de-asserted, re-initializing memory 700 (block 907). Mode 711 may be set for test read operation and clk 710 may be asserted. In response to the assertion of clk 710, timing and control unit 702 asserts decoders enable 708, causing decoder 703 to decode the address presented to add 712 (block 908). Address decoder 703 then asserts one of row selects 706 and one of column selects 707, selecting a data storage cell in each of the sub-arrays 701a, 701b, and 701c (block 909). Timing and control unit 702 may then assert the necessary control signals 705 to activate the load circuits in sub-arrays 701a, 701b, and 701c (block 910). Dependent upon original test data, the load circuits may couple the load devices to either the true input or the complement input of the sense amplifiers. Timing and control unit 702 may then assert the necessary control signals 705 to activate the sense amplifiers, causing the sense amplifiers to amplify the data from the selected data storage cells and output the amplified data to dio 709.

The operation then depends on the value of the data output on dio 709 (block 912). When the data output on dio 709 matches the originally loaded test data, the selected data storage cells have sufficient read current to overcome the additional load provided by the load circuits. The address that selected these data storage cells may be noted as containing cells of normal strength (block 914). The test operation at the given address is the complete (block 915). When the data output on dio 709 does not match the originally loaded test data, one or more of the selected data storage cells do not have sufficient read current to overcome the additional load provided by the load circuits. The address that selected these data storage cells may be noted as containing weak data storage cells (block 913). The test operation at the given address may then be complete (block 915). In some embodiments, the address may be loaded into storage unit 714 such that when the given address is encountered in subsequent read access to memory 700, address comparator 704 asserts misread indication signal 713. It is noted that during actual circuit operation, some or all of the operations illustrated in FIG. 9 may occur in a different order, or may occur concurrently rather than sequentially.

Figure 10:
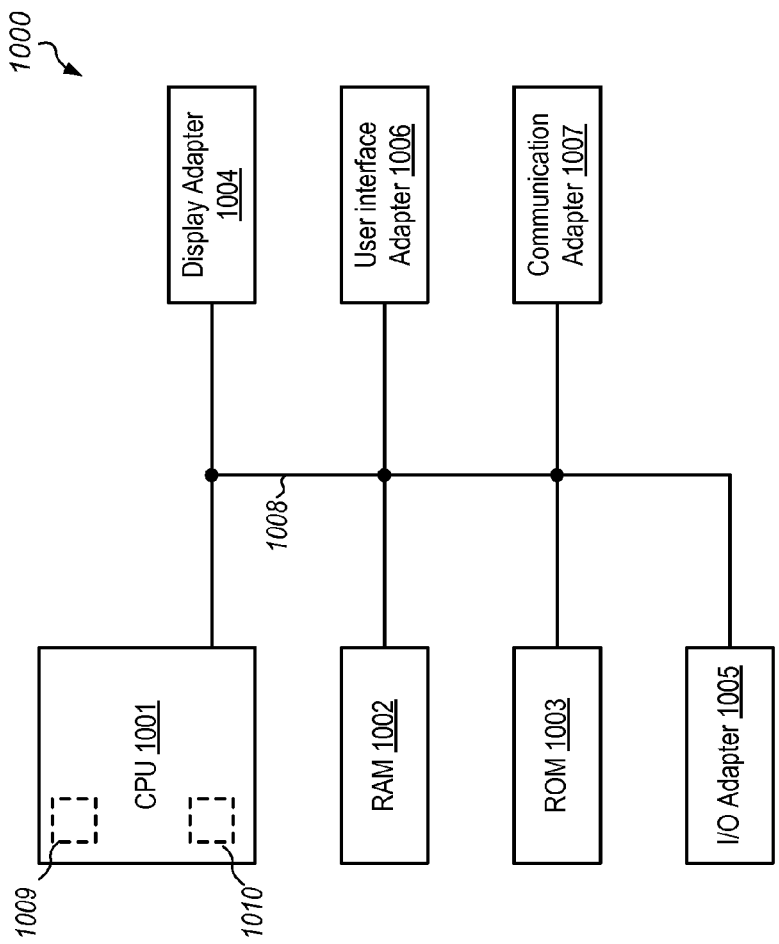
FIG. 10 illustrates an embodiment of a computing system.

Turning now to FIG. 10, a block diagram of a system is illustrated. In the illustrated embodiment, the system 1000 includes an instance of a random access memory (RAM) 1002 and a read-only memory (ROM) 1003 each of which each may include one or more sub-arrays that may incorporate some or all of the features described above with respect to sub-array 300.

The illustrated embodiment also includes a CPU 1001 which may include one or more local storage units 1009. For example, CPU 1001 may include a Cache Data RAM, a Tag RAM, one or more register files, and one or more FIFOs. Each one of the local storage units 1009 may include one or more load circuits that may incorporate some or all of the features described above with respect to load circuits 500 and 600. In some embodiments, CPU 1001 may include a test unit 1010 configured to operate the load circuits. Additionally, the illustrated embodiment includes an I/O adapter 1005, a display adapter 1004, a user interface adapter 1006, and a communication adapter 1007.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a plurality of columns;
      wherein each of the columns includes a plurality of data storage cells, wherein each given one of the data storage cells is configured such that in response to assertion of a row selection signal, the given data storage cell generates a column output; and
   a column multiplexer coupled to receive input data from the plurality of columns, wherein the column multiplexer is configured to controllably select data from one of the plurality of columns to generate a column multiplexer output signal dependent upon a column selection signal; and
   a sense amplifier configured to amplify the column multiplexer output signal by the gain level of the sense amplifier in response to assertion of a control signal; and
   a load circuit configured to couple a load device to the input of the sense amplifier, wherein the load circuit is controllable to provide a first load or a second load dependent upon a load selection signal.

2. The apparatus of claim 1, wherein the load device includes one or more capacitors.

3. The apparatus of claim 1, wherein the load device includes one or more de-selected data storage cells.

4. The apparatus of claim 1, wherein the sense amplifier is further configured to receive input data from the column multiplexer that is differentially encoded, and wherein the load circuit is further configured to couple to a selected one of the sense amplifier differential inputs in response to the assertion of a data selection signal.

5. An apparatus, comprising:
   a plurality of data storage cells, wherein each data storage cell of the plurality of data storage cells is configured to generate a differentially encoded output signal in response to an assertion of a selection signal; and
   a sense amplifier including a first input and a second input, wherein the sense amplifier is configured to amplify the differentially encoded output signal of a selected data storage cell of the plurality of data storage cells; and a load circuit configured to couple a first capacitive load to the first input of the sense amplifier when reading a first data storage cell of the plurality of data storage cells, and to couple a second capacitive load to the first input of the sense amplifier when reading a second data storage cell of the plurality of data storage cells.

6. The apparatus of claim 5, wherein the second capacitive load is greater than the first capacitive load.

7. The apparatus of claim 5, wherein the load circuit is further configured to pre-charge the first capacitive load and the second capacitive load to the supply voltage.

8. The apparatus of claim 5, wherein the load circuit is further configured to simultaneously couple the first capacitive load and the second capacitive load to the input of the sense amplifier.

9. A memory circuit, comprising:
a plurality of sub-arrays;
  wherein each of the sub-arrays comprises:
    a plurality of columns;
      wherein each of the columns comprises:
        a plurality of data storage cells, wherein each given one of the data storage cells is configured such that, in response to the assertion of a respective one of a plurality of row selection signals, the given data storage cells generates a column output signal; and
    a column multiplexer coupled to receive the column output signal from one of the plurality of columns wherein the column multiplexer is configured to controllably select the column output signal from one of the plurality of columns in response to the assertion of a respective one of a plurality of column selection signals; and
    a sense amplifier configured to amplify the column output signal from the selected one of the plurality of columns; and
    a load circuit configured to couple a load device to the input of the sense amplifier in response to assertion of a test signal; and
a timing and control unit configured to generate the test signal; and
an address decoder configured to assert one of the plurality of row select signals and one of the plurality of column select signals dependent upon an input address.

10. The memory of claim 9, wherein the address decoder includes a storage array and a comparator configured to compare the input address to the contents of the storage array.

11. The memory of claim 9, wherein the plurality of data storage cells are further configured to output differentially encoded data, and wherein the sense amplifier is further configured to amplify differentially encoded data.

12. The memory of claim 11, wherein the load circuit is further configured to couple the load device to a selected one of the sense amplifier differential inputs dependent upon a data selection signal.

13. A system, comprising:
a processing unit; and
one or more memories;
  wherein the processing unit comprises:
    one or more storage arrays;
    wherein each of the each of the storage arrays comprises:
      a plurality of data storage cells; and
      a plurality of output circuits;
      wherein each of the output circuits comprises:
        a sense amplifier configured to amplify data from a selected one of the plurality of data storage cells; and
        a load circuit configured to couple a load device to the input of the sense amplifier in response to assertion of a test signal.

14. The system of claim 13, wherein the processing unit includes a test unit configured to generate the test signal for each given one of the storage arrays.

15. The system of claim 14, wherein the load circuit is further configured to couple a first load device, or to couple a second load device to the input of the sense amplifier dependent upon a load selection signal.

16. The system of claim 15, wherein the test unit is further configured to generate the load selection signal for each given one of the storage arrays.

* * * * *